(12) United States Patent
Sulfridge

(10) Patent No.: US 8,247,907 B2
(45) Date of Patent: Aug. 21, 2012

(54) METHODS FOR FORMING INTERCONNECTS IN MICROELECTRONIC WORKPIECES AND MICROELECTRONIC WORKPIECES FORMED USING SUCH METHODS

(75) Inventor: Marc Sulfridge, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/020,656

(22) Filed: Feb. 3, 2011

(65) Prior Publication Data
US 2011/0133302 A1 Jun. 9, 2011

Related U.S. Application Data

(62) Division of application No. 11/951,751, filed on Dec. 6, 2007, now Pat. No. 7,884,015.

(51) Int. Cl.
*H01L 29/41* (2006.01)
(52) U.S. Cl. .................. 257/774; 257/773; 257/E21.597
(58) Field of Classification Search .................. 438/667, 438/780, E21.597; 257/773, 774, 777, E21.597
See application file for complete search history.

(56) References Cited

U.S. PATENT DOCUMENTS

| | | |
|---|---|---|
| 2,821,959 A | 2/1958 | Franz |
| 3,006,318 A | 10/1961 | Monroe, Jr. et al. |
| 3,345,134 A | 10/1967 | Heymer et al. |
| 3,865,298 A | 2/1975 | Allen et al. |
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |

(Continued)

FOREIGN PATENT DOCUMENTS

DE 10205026 C1 5/2003

(Continued)

OTHER PUBLICATIONS

Aachboun, S. and P. Ranson, "Cryogenic etching of deep narrow trenches in silicon," J. Vac. Sci. Technol. A 18 (4), Jul./Aug. 2000, pp. 1848-1852.

(Continued)

*Primary Examiner* — Charles Garber
*Assistant Examiner* — Bryan Junge
(74) *Attorney, Agent, or Firm* — Perkins Coie LLP

(57) ABSTRACT

Methods for forming interconnects in microelectronic workpieces and microelectronic workpieces formed using such methods are disclosed herein. One embodiment, for example, is directed to a method of processing a microelectronic workpiece including a semiconductor substrate having a plurality of microelectronic dies. The individual dies include integrated circuitry and a terminal electrically coupled to the integrated circuitry. The method can include forming a first opening in the substrate from a back side of the substrate toward a front side and in alignment with the terminal. The first opening has a generally annular cross-sectional profile and separates an island of substrate material from the substrate. The method can also include depositing an insulating material into at least a portion of the first opening, and then removing the island of substrate material to form a second opening aligned with at least a portion of the terminal. In several embodiments, the method may include constructing an electrically conductive interconnect in at least a portion of the second opening and in electrical contact with the terminal.

14 Claims, 9 Drawing Sheets

U.S. PATENT DOCUMENTS

| | | |
|---|---|---|
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,818,728 A | 4/1989 | Rai et al. |
| 4,907,127 A | 3/1990 | Lee |
| 4,959,705 A | 9/1990 | Lemnios et al. |
| 4,964,212 A | 10/1990 | Deroux-Dauphin et al. |
| 5,006,922 A | 4/1991 | McShane et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,098,864 A | 3/1992 | Mahulikar |
| 5,102,829 A | 4/1992 | Cohn |
| 5,123,902 A | 6/1992 | Muller et al. |
| 5,144,412 A | 9/1992 | Chang et al. |
| 5,145,099 A | 9/1992 | Wood et al. |
| 5,158,911 A | 10/1992 | Quentin et al. |
| 5,200,366 A | 4/1993 | Yamada et al. |
| 5,219,344 A | 6/1993 | Yoder, Jr. |
| 5,233,448 A | 8/1993 | Wu et al. |
| 5,237,148 A | 8/1993 | Aoki et al. |
| 5,289,631 A | 3/1994 | Koopman et al. |
| 5,291,062 A | 3/1994 | Higgins, III |
| 5,292,686 A | 3/1994 | Riley et al. |
| 5,304,743 A | 4/1994 | Sen et al. |
| 5,378,312 A | 1/1995 | Gifford et al. |
| 5,378,313 A | 1/1995 | Pace |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,438,212 A | 8/1995 | Okaniwa et al. |
| 5,447,871 A | 9/1995 | Goldstein |
| 5,464,960 A | 11/1995 | Hall et al. |
| 5,481,483 A | 1/1996 | Ebenstein |
| 5,485,039 A | 1/1996 | Fujita et al. |
| 5,496,755 A | 3/1996 | Bayraktaroglu |
| 5,515,167 A | 5/1996 | Ledger et al. |
| 5,518,956 A | 5/1996 | Liu et al. |
| 5,550,403 A | 8/1996 | Carichner |
| 5,585,308 A | 12/1996 | Sardella |
| 5,585,675 A | 12/1996 | Knopf |
| 5,614,743 A | 3/1997 | Mochizuki et al. |
| 5,618,752 A | 4/1997 | Gaul |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,673,846 A | 10/1997 | Gruber |
| 5,684,642 A | 11/1997 | Zumoto et al. |
| 5,690,841 A | 11/1997 | Elderstig et al. |
| 5,718,791 A | 2/1998 | Spengler et al. |
| 5,723,904 A | 3/1998 | Shiga |
| 5,726,493 A | 3/1998 | Yamashita et al. |
| 5,734,555 A | 3/1998 | McMahon |
| 5,771,158 A | 6/1998 | Yamagishi et al. |
| 5,773,359 A | 6/1998 | Mitchell et al. |
| 5,776,824 A | 7/1998 | Farnworth et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,893,828 A | 4/1999 | Uram |
| 5,904,499 A | 5/1999 | Pace |
| 5,969,422 A | 10/1999 | Ting et al. |
| 5,998,240 A | 12/1999 | Hamilton et al. |
| 5,998,292 A | 12/1999 | Black et al. |
| 6,004,867 A | 12/1999 | Kim et al. |
| 6,008,070 A | 12/1999 | Farnworth |
| 6,008,914 A | 12/1999 | Sasagawa et al. |
| 6,080,291 A | 6/2000 | Woodruff et al. |
| 6,097,087 A | 8/2000 | Farnworth et al. |
| 6,103,547 A | 8/2000 | Corisis et al. |
| 6,107,180 A | 8/2000 | Munroe et al. |
| 6,107,186 A | 8/2000 | Erb |
| 6,107,679 A | 8/2000 | Noguchi |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,133,622 A | 10/2000 | Corisis et al. |
| 6,137,163 A | 10/2000 | Kim et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,180,518 B1 | 1/2001 | Layadi et al. |
| 6,184,060 B1 | 2/2001 | Siniaguine |
| 6,184,465 B1 | 2/2001 | Corisis |
| 6,187,615 B1 | 2/2001 | Kim et al. |
| 6,191,487 B1 | 2/2001 | Rodenbeck et al. |
| 6,203,539 B1 | 3/2001 | Shimmick et al. |
| 6,221,769 B1 | 4/2001 | Dhong et al. |
| 6,222,136 B1 | 4/2001 | Appelt et al. |
| 6,222,270 B1 | 4/2001 | Lee et al. |
| 6,228,687 B1 | 5/2001 | Akram et al. |
| 6,229,202 B1 | 5/2001 | Corisis |
| 6,235,552 B1 | 5/2001 | Kwon et al. |
| 6,246,108 B1 | 6/2001 | Corisis et al. |
| 6,252,300 B1 | 6/2001 | Hsuan et al. |
| 6,268,114 B1 | 7/2001 | Wen et al. |
| 6,271,580 B1 | 8/2001 | Corisis |
| 6,277,757 B1 | 8/2001 | Lin et al. |
| 6,291,894 B1 | 9/2001 | Farnworth et al. |
| 6,294,837 B1 | 9/2001 | Akram et al. |
| 6,297,155 B1 | 10/2001 | Simpson et al. |
| 6,324,253 B1 | 11/2001 | Yuyama et al. |
| 6,326,689 B1 | 12/2001 | Thomas |
| 6,326,697 B1 | 12/2001 | Farnworth |
| 6,329,632 B1 | 12/2001 | Fournier et al. |
| 6,341,009 B1 | 1/2002 | O'Connor et al. |
| 6,344,976 B1 | 2/2002 | Schoenfeld et al. |
| 6,353,262 B1 * | 3/2002 | Honda .......................... 257/773 |
| 6,359,254 B1 | 3/2002 | Brown |
| 6,359,328 B1 | 3/2002 | Dubin |
| 6,372,548 B2 | 4/2002 | Bessho et al. |
| 6,388,208 B1 | 5/2002 | Kiani et al. |
| 6,391,770 B2 | 5/2002 | Kosaki et al. |
| 6,406,636 B1 | 6/2002 | Vaganov |
| 6,432,821 B1 | 8/2002 | Dubin et al. |
| 6,433,303 B1 | 8/2002 | Liu et al. |
| 6,433,304 B2 | 8/2002 | Okumura et al. |
| 6,437,284 B1 | 8/2002 | Okamoto et al. |
| 6,437,441 B1 | 8/2002 | Yamamoto et al. |
| 6,441,487 B2 | 8/2002 | Elenius et al. |
| 6,444,576 B1 | 9/2002 | Kong |
| 6,448,106 B1 | 9/2002 | Wang et al. |
| 6,452,270 B1 | 9/2002 | Huang et al. |
| 6,455,425 B1 | 9/2002 | Besser et al. |
| 6,457,515 B1 | 10/2002 | Vafai et al. |
| 6,459,039 B1 | 10/2002 | Bezama et al. |
| 6,459,150 B1 | 10/2002 | Wu et al. |
| 6,468,889 B1 | 10/2002 | Iacoponi et al. |
| 6,486,549 B1 | 11/2002 | Chiang et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,545,563 B1 | 4/2003 | Smith |
| 6,555,782 B2 | 4/2003 | Isaji et al. |
| 6,560,047 B2 | 5/2003 | Choi et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |

| Patent | Date | Inventor |
|---|---|---|
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,606,251 B1 | 8/2003 | Kenny, Jr. et al. |
| 6,614,033 B2 | 9/2003 | Suguro et al. |
| 6,620,031 B1 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,746,971 B1 | 6/2004 | Ngo et al. |
| 6,750,144 B2 | 6/2004 | Taylor |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel et al. |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,841,849 B2 | 1/2005 | Miyazawa |
| 6,847,109 B2 | 1/2005 | Shim |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,936,536 B2 | 8/2005 | Sinha |
| 6,939,343 B2 | 9/2005 | Sumiya |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa |
| 7,033,927 B2 | 4/2006 | Cohen et al. |
| 7,037,836 B2 | 5/2006 | Lee |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,111,149 B2 | 9/2006 | Eilert |
| 7,129,112 B2 | 10/2006 | Matsuo |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Meyers et al. |
| 7,186,650 B2 | 3/2007 | Dakshina-Murthy |
| 7,190,061 B2 | 3/2007 | Lee et al. |
| 7,199,050 B2 | 4/2007 | Hiatt |
| 7,214,615 B2 | 5/2007 | Miyazawa |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,300,857 B2 | 11/2007 | Akram et al. |
| 7,317,256 B2 | 1/2008 | Williams et al. |
| 7,378,726 B2 | 5/2008 | Punzalan et al. |
| 7,408,265 B2 | 8/2008 | Holscher et al. |
| 7,449,098 B1 | 11/2008 | Mayer et al. |
| 7,491,582 B2 | 2/2009 | Yokoyama et al. |
| 7,498,661 B2 | 3/2009 | Matsuo |
| 2001/0020739 A1 | 9/2001 | Honda |
| 2002/0005583 A1 | 1/2002 | Harada et al. |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0074615 A1 | 6/2002 | Honda |
| 2002/0094607 A1 | 7/2002 | Gebauer et al. |
| 2002/0096729 A1 | 7/2002 | Tu et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0119308 A1 | 6/2003 | Geefay et al. |
| 2003/0148597 A1 | 8/2003 | Tan et al. |
| 2003/0216023 A1 | 11/2003 | Wark et al. |
| 2003/0222354 A1* | 12/2003 | Mastromatteo et al. ...... 257/774 |
| 2004/0004280 A1 | 1/2004 | Shibata |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2004/0265562 A1 | 12/2004 | Uzoh et al. |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |

| | | |
|---|---|---|
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0189637 A1 | 9/2005 | Okayama et al. |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0227382 A1 | 10/2005 | Hui |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0272221 A1 | 12/2005 | Yen et al. |
| 2005/0275048 A1 | 12/2005 | Farnworth et al. |
| 2005/0275049 A1* | 12/2005 | Kirby et al. .................. 257/433 |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0003566 A1 | 1/2006 | Emesh |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0057776 A1 | 3/2006 | Tao |
| 2006/0057836 A1 | 3/2006 | Nagarajan et al. |
| 2006/0071347 A1 | 4/2006 | Dotta |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0195729 A1 | 8/2006 | Huppenthal et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0281224 A1 | 12/2006 | Edelstein et al. |
| 2006/0281243 A1* | 12/2006 | Trezza .......................... 438/207 |
| 2006/0289967 A1 | 12/2006 | Heck et al. |
| 2006/0289968 A1 | 12/2006 | Sulfridge |
| 2006/0290001 A1 | 12/2006 | Sulfridge |
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1* | 3/2007 | Andry et al. .................. 438/106 |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0122940 A1 | 5/2007 | Gautham |
| 2007/0126091 A1 | 6/2007 | Wood et al. |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |
| 2008/0203556 A1 | 8/2008 | Huang |
| 2008/0265933 A1 | 10/2008 | Tanioka et al. |
| 2008/0299759 A1 | 12/2008 | Chatterjee et al. |
| 2008/0299762 A1 | 12/2008 | Mathew et al. |
| 2008/0318361 A1 | 12/2008 | Han et al. |
| 2009/0007934 A1 | 1/2009 | Hutto |
| 2009/0014859 A1 | 1/2009 | Jeung et al. |
| 2009/0057912 A1 | 3/2009 | Kheng |

| | | | |
|---|---|---|---|
| 2009/0091962 | A1 | 4/2009 | Chung et al. |
| 2009/0127668 | A1 | 5/2009 | Choi |
| 2009/0166846 | A1 | 7/2009 | Pratt et al. |
| 2009/0180257 | A1 | 7/2009 | Park et al. |
| 2009/0224405 | A1 | 9/2009 | Chiou et al. |
| 2009/0283898 | A1 | 11/2009 | Janzen et al. |
| 2009/0315154 | A1 | 12/2009 | Kirby et al. |
| 2009/0321947 | A1 | 12/2009 | Pratt |

FOREIGN PATENT DOCUMENTS

| | | |
|---|---|---|
| EP | 0127946 A1 | 12/1984 |
| EP | 1154474 A1 | 11/2001 |
| EP | 1415950 A2 | 5/2004 |
| JP | 63052432 A | 3/1988 |
| JP | 01252308 | 10/1989 |
| JP | 02235589 A | 9/1990 |
| JP | 05104316 | 4/1993 |
| JP | 2001077496 | 3/2001 |
| JP | 2001082931 | 3/2001 |
| JP | 2001298147 A | 10/2001 |
| JP | 2002018585 A | 1/2002 |
| JP | 2005093980 A | 4/2005 |
| JP | 2005310817 A | 11/2005 |
| KR | 20010018694 | 3/2001 |
| KR | 20020022122 A | 3/2002 |
| KR | 20020061812 A | 7/2002 |
| TW | 250597 B | 3/2006 |
| WO | 2004109770 A2 | 12/2004 |
| WO | 2005022965 A2 | 3/2005 |
| WO | 2005036940 A1 | 4/2005 |
| WO | 2006053036 A2 | 5/2006 |
| WO | 2006124597 A2 | 11/2006 |
| WO | 2007025812 A1 | 3/2007 |
| WO | 2007043718 A1 | 4/2007 |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Blackburn, J.M. et al., "Deposition of Conformal Copper and Nickel Films from Supercritical Carbon Dioxide," Science, vol. 94, Oct. 2001, pp. 141-145.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, Vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Hirafune, S. et al., "Packaging Technology for Imager Using Through-hole Interconnection in Si Substrate," Proceeding of HDP'04, IEEE, pp. 303-306, Jul. 2004.

International Search Report and Written Opinion issued Mar. 2, 2009 in International Application No. PCT/US2008/084045.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Kyocera Corporation, Memory Package, 1 page, retrieved from the Internet on Dec. 3, 2004, <http://global.kyocera.com/prdct/semicon/ic_pkg/memory_p.html>.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al., "Through Silicon Via and 3-D Wafer/Chip Stacking Technology," 2006 Symposium on VLSI Circuits, Digest of Technical Papers, pp. 89-92, IEEE, ISBN: 1-4244-006-6.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Thomas, D.J. et al., "Etching of Vias and Trenches Through Low k Dielectrics with Feature Sizes Down to 0.1 mm Using M0RIO High Density Plasmas," presented at the 197th Meeting of the Electrochemical Society, Toronto 2000, <http://www.trikon.corn/pdfs/ECS2b.pdf>.

Trigas, C., "System-In-Package or System-On-Chip?," EE Times, Sep. 19, 2003, <http://www.eetimes.com/story/OEG20030919S0049>.

Vereecken, P.M. et al., "The chemistry of additives in damascene copper plating," IBM J. Res. & Dev., vol. 49, No. 1, pp. 3-18, Jan. 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

\* cited by examiner

METHODS FOR FORMING INTERCONNECTS IN MICROELECTRONIC WORKPIECES AND MICROELECTRONIC WORKPIECES FORMED USING SUCH METHODS

CROSS-REFERENCE TO RELATED APPLICATION

This application is a divisional of U.S. application Ser. No. 11/951,751 filed Dec. 6, 2007, now U.S. Pat. No. 7,884,015, which is incorporated herein by reference in its entirety.

TECHNICAL FIELD

The present disclosure is related to methods for forming interconnects in microelectronic workpieces and microelectronic workpieces formed using such methods.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

Many imaging devices include semiconductor dies having image sensors located on a front surface of the die to receive incoming radiation. The dies also include external contacts or terminals for electrically coupling the sensors to other circuit elements. In order to prevent the external contacts from interfering with the operation of the sensors or limiting the size and/or location of the sensors, the external contacts at the front surface can be electrically coupled to corresponding external contacts positioned on the opposite side of the die from the sensors (e.g., on the back surface of the die). Through-wafer interconnects (TWIs) are typically used to conduct electrical signals from the sensors, front side external contacts, and associated internal circuitry through the die to the external contacts at the back surface. The TWIs are typically formed by (a) making openings or holes in the die and aligned with the corresponding external contacts, (b) lining the sidewalls of the openings with a dielectric material, and (c) filling the openings with a conductor. Solder balls or other type of electrical couplers can then be attached to the back side external contacts and can be reflowed to couple the die to external devices.

DETAILED DESCRIPTION

The following disclosure describes several embodiments of methods for forming interconnects in microelectronic workpieces and microelectronic workpieces formed using such methods. Such interconnects electrically couple terminals or other conductive elements proximate to one side of the workpiece to conductive elements proximate to the other side of the workpiece. Specific details of several embodiments are described below with reference to CMOS image sensors to provide a thorough understanding of these embodiments, but other embodiments can use CCD image sensors or other types of solid-state imaging devices. In still further embodiments, aspects of the disclosure can be practiced in connection with devices that do not include image sensors. Such devices include SRAM, DRAM, Flash, and other devices. In particular embodiments, the devices can be stacked on each other, and the vias can provide electrical communication among the stacked devices.

As used herein, the terms "microelectronic workpiece" and "workpiece" refer to substrates on and/or in which microfeature electronic devices (including, but not limited to, image sensors) are integrally formed. A microelectronic workpiece can include a wafer and/or individual dies or combinations of dies that make up the wafer. Typical electronic devices formed on and/or in microelectronic workpieces include processors, memory, imagers, thin-film recording heads, data storage elements, and other products with integrated circuits. Micromachines and other micromechanical devices are included within this definition because they are manufactured using much of the same technology that is used in the fabrication of integrated circuits. The substrates can be semi-conductive pieces (e.g., doped silicon wafers or gallium arsenide wafers), non-conductive pieces (e.g., various ceramic substrates), or conductive pieces. In some cases, the workpieces are generally round, and in other cases the workpieces can have other shapes, including rectilinear shapes. Several embodiments of methods for forming interconnects in connection with microelectronic workpiece fabrication are described below. A person skilled in the relevant art will understand, however, that the disclosure has additional embodiments, and that the disclosure may be practiced without several of the details of the embodiments described below with reference to FIGS. 1-4.

Figure 1:
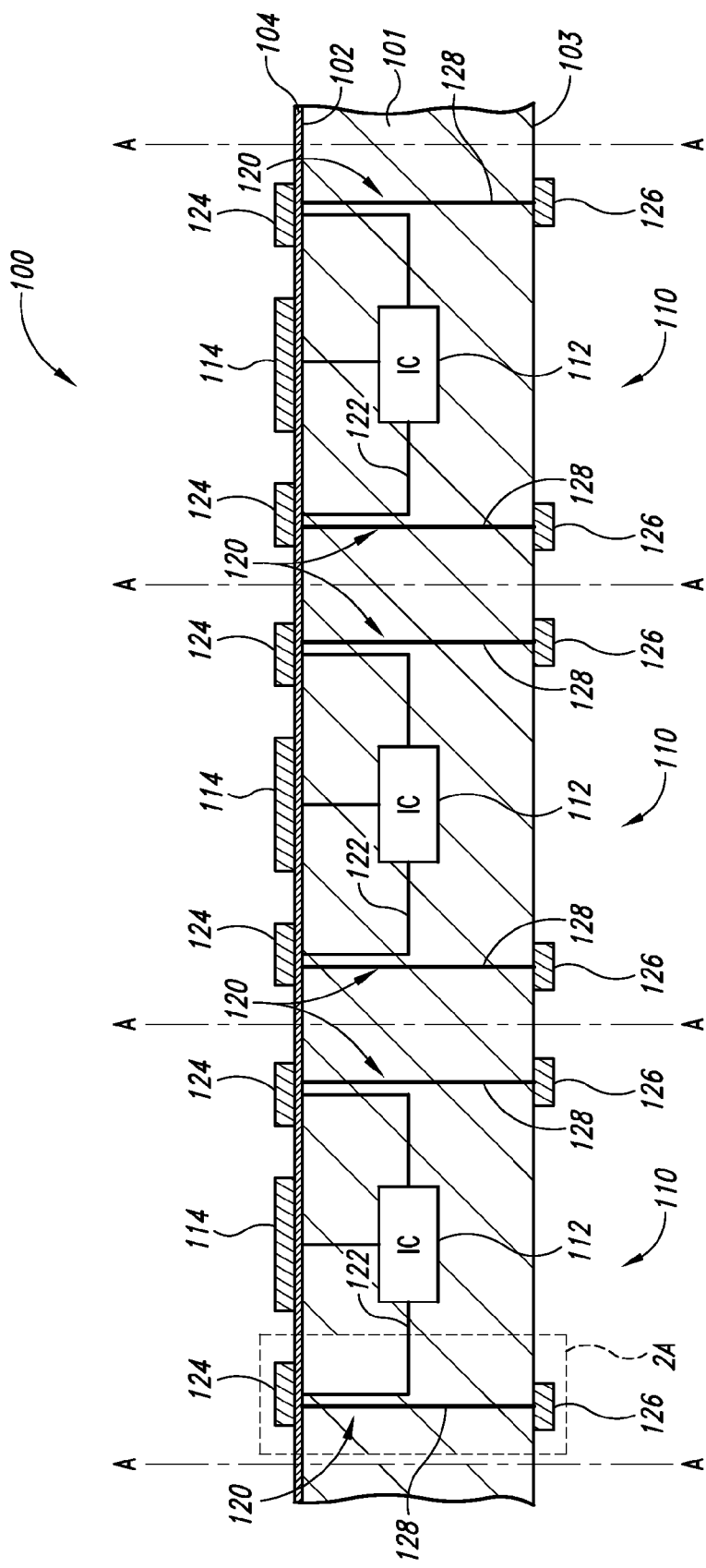
FIG. 1 is a side cross-sectional view of a portion of a microelectronic workpiece configured in accordance with several embodiments of the disclosure.

FIG. 1 is a side cross-sectional view of a portion of a microelectronic workpiece 100 configured in accordance with several embodiments of the disclosure. The workpiece 100 can include a semiconductor substrate 101 with a plurality of dies 110 (e.g., imaging dies) formed in and/or on the substrate 101. The substrate 101 has a first or front side 102 and a second or back side 103. The substrate 101, for example, may be a semiconductor wafer with the dies 110 arranged in a die pattern on the wafer. A first dielectric layer 104 (e.g., a passivation layer or other insulating layer) can be located at the front side 102 to protect the underlying substrate 101. The first dielectric layer 104 can include silicon dioxide ($SiO_2$), silicon nitride ($Si_3N_4$), borophosphosilicate glass (BPSG), borosilicate glass (BSG), or another suitable dielectric material.

Individual dies 110 can include integrated circuitry 112, external contacts 120 electrically coupled to the integrated circuitry 112 with couplers 122, and an image sensor 114. The image sensors 114 can be CMOS image sensors or CCD image sensors for capturing pictures or other images in the visible spectrum. In other embodiments, the image sensors 114 can detect radiation in other spectrums (e.g., IR or UV ranges). Although the illustrated dies 110 have the same structure, in other embodiments the dies 110 can have different features to perform different functions.

The external contacts 120 shown in FIG. 1 provide a small array of back side contacts within the footprint of each die 110. Each external contact 120, for example, can include a terminal or bond site 124 (e.g., a bond-pad), an external contact pad 126 (e.g., a ball-pad), and an interconnect 128 coupling the terminal 124 to the contact pad 126. In the embodiment shown in FIG. 1, the terminals 124 are external features at the front side 102 of the substrate 101, the contact pads 126 are external features at the back side 103 of the substrate 101, and the interconnects 128 are through-substrate or through-wafer interconnects that extend completely through the substrate 101 to couple the terminals 124 to corresponding contact pads 126. In other embodiments, however, the terminals 124 can be internal features that are embedded at an intermediate depth within the substrate 101. In still other embodiments, the dies 110 may not include the terminals 124 at the front side 102 of the substrate 101 such that the integrated circuitry 112 is coupled directly to the contact pads 126 at the back side 103 of the substrate 101 by interconnects that extend only through a portion of the substrate 101. After forming the interconnects 128, the workpiece 100 can be cut along lines A-A to singulate the imaging dies 110.

In contrast with conventional dies that only include front side contacts, the interconnects 128 enable the external contact pads 126 to be located at the back side 103 of the substrate 101. The back side arrays of contact pads 126 allow the dies 110 to be stacked on other devices or attached directly to an interposer substrate without peripheral wire-bonds. The dies 110 with the interconnects 128 can be more robust than dies that require wire-bonds, and the individual dies 110 also have a significantly smaller footprint and profile than conventional dies having wire-bonds extending outboard of the periphery portions of the respective die. Accordingly, the resulting imaging devices can have a significantly smaller footprint and lower profile than conventional imagers that require large interposing structures, and can be used in smaller electronic devices or other applications where space is limited.

In the embodiment illustrated in FIG. 1, formation of the interconnects 128 is complete. FIGS. 2A-3G described below illustrate various embodiments of methods for forming the interconnects 128 shown in FIG. 1. Although the following description illustrates formation of only a single interconnect, it will be appreciated that a plurality of interconnects are constructed simultaneously through a plurality of imaging dies on a wafer.

Figure 2A:
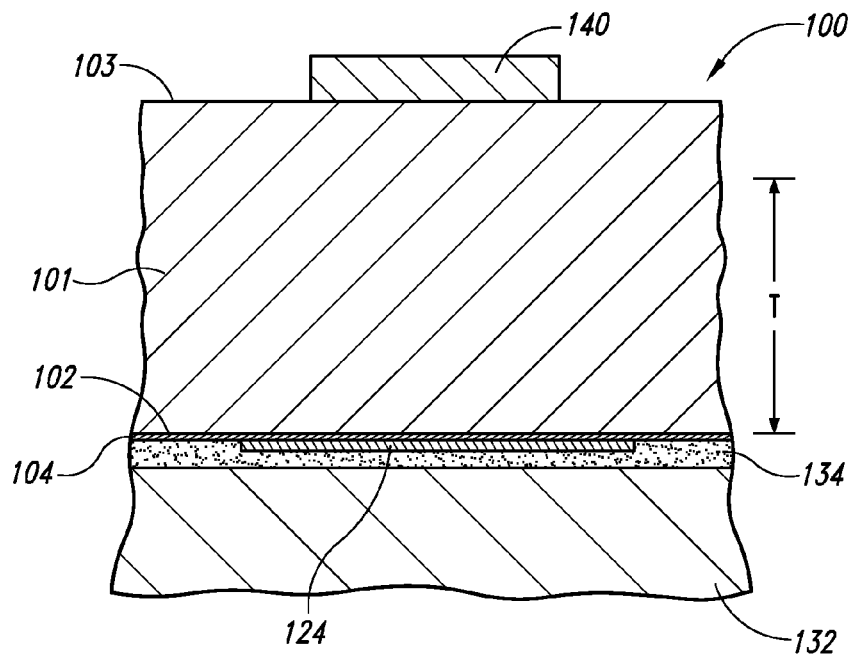
FIGS. 2A-2H are schematic, side cross-sectional views illustrating various stages in a method for forming an electrically conductive interconnect structure for providing a back side array of contact pads in accordance with an embodiment of the disclosure.

FIGS. 2A-2H illustrate various stages of a method for forming one embodiment of the interconnects 128 of FIG. 1. FIG. 2A, more specifically, is a schematic side cross-sectional view of the area 2A shown in FIG. 1 at an initial stage of this process. In previous processing steps, the front side 102 of the substrate 101 was attached to a support member 132 (e.g., a carrier substrate) with an adhesive material 134. The support member 132 (only a portion of which is shown) can be sized and shaped to receive the workpiece 100 and provide support to the workpiece during subsequent processing steps to prevent the workpiece from breaking and/or excessively warping. In one embodiment, the support member 132 is generally rigid and has a planform shape at least approximately identical to that of the workpiece 100. In other embodiments, however, the support member 132 can have a different planform shape than the workpiece 100. The support member 132 can include a glass substrate, a silicon substrate, or a substrate formed from another suitable material.

After attaching the workpiece 100 to the support member 132, the substrate 101 is thinned to a desired thickness "T" by removing material from the back side 103 of the substrate 101. In the illustrated embodiment, for example, the final thickness T of the substrate 101 is about 100-150 microns. In other embodiments, however, the substrate 101 can have a different final thickness T. The thickness of the support member 132 and/or the adhesive layer 134 may also be adjusted so that the overall assembly has a desired thickness. For example, the support member 132 can have a thickness of about 600-650 microns so that the aggregate thickness of the assembly (about, for example, 700-750 µm) can be suitable for the form factor of typical semiconductor processing equipment used for subsequent processing of the workpiece 100. The back side 103 of the substrate 101 can be thinned using chemical-mechanical planarization (CMP) processes, dry etching processes, chemical etching processes, chemical polishing, grinding procedures, or other suitable processes. The back side 103 of the substrate 101 can undergo further processing after thinning In one embodiment, for example, the back side 103 can be polished before any subsequent processing. This polishing step, however, is an optional step that may be omitted and/or performed at a different processing stage.

After thinning the substrate 101, a first mask 140 is applied over the back side 103 and patterned. The first mask 140 can be a layer of resist that is patterned according to the arrangement of terminals 122 at the front side 102 of the substrate 101. In the illustrated embodiment, for example, the first mask 140 is aligned with a corresponding terminal 124. The individual mask portions can remain on the workpiece 100 during a number of processing steps. Accordingly, the portions of the first mask 140 at the back side 103 of the substrate 101 can be "overbaked" to harden the mask portions so that they do not easily wash away or become damaged during subsequent processing steps.

Figure 2B:
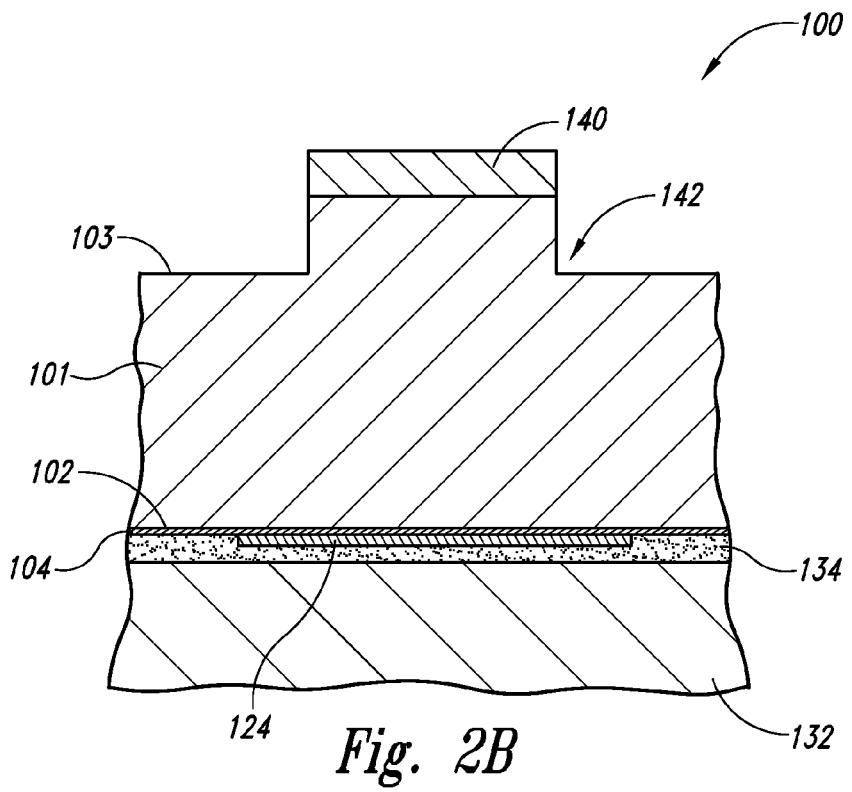

Referring next to FIG. 2B, the back side 103 of the substrate 101 is etched to an intermediate depth using a first etching process, such as an anisotropic etch, to form a pillar 142. In an anisotropic etching process, for example, the etchant removes exposed material, but not material protected beneath the remaining portions of the mask 140. Accordingly, the sidewalls of the pillar 142 are generally normal to the front side 102 of the substrate 101. In other embodiments, however, other suitable etching processes may be used.

Figure 2C:
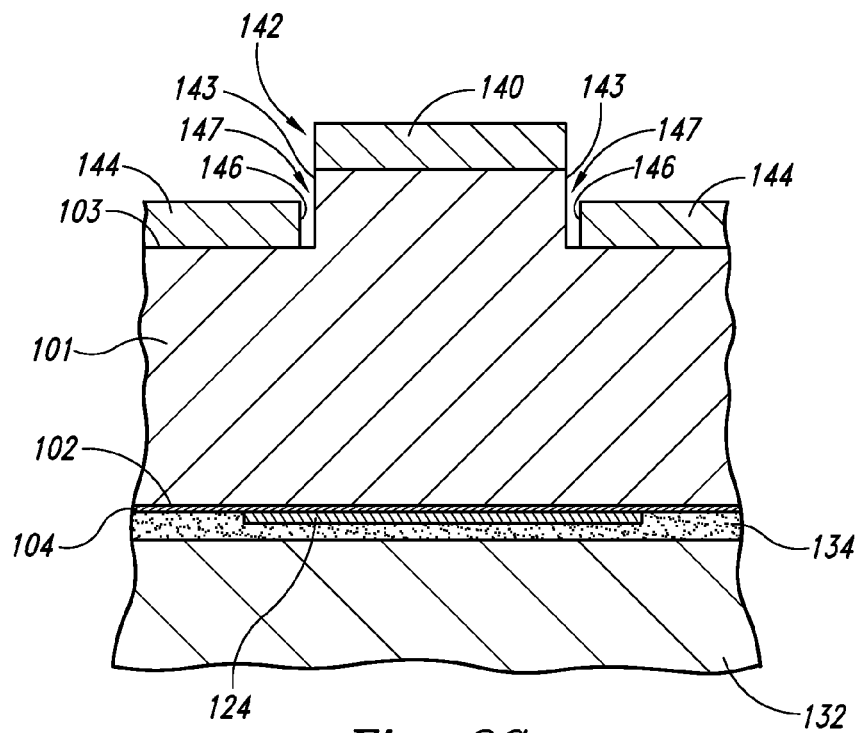
Figure 2D:
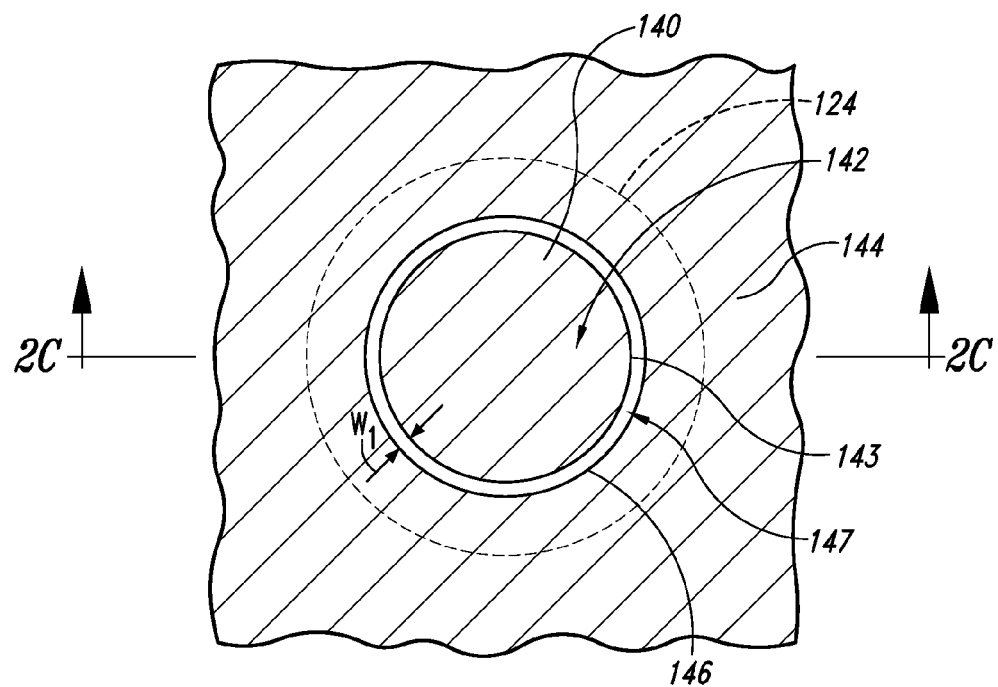

Referring to FIG. 2C, a second mask 144 is applied onto the back side 103 and patterned to form a first opening 146 around the pillar 142. FIG. 2D is a top plan view of the portion of the back side 103 of the substrate 101 shown in FIG. 2C. Referring to FIGS. 2C and 2D together, the second mask 144 is patterned such that the first opening 146 is (a) inboard of a periphery portion of the terminal 124, and (b) outboard of a periphery portion 143 of the pillar 142 to define an annulus 147. The annulus 147 is superimposed relative to the terminal 124 and has a first diameter or cross-sectional dimension less than a second diameter or cross-sectional dimension of the terminal 124. For purposes of this disclosure, an "annulus" or an opening have an "annular cross-sectional profile" refers to an opening or region between two generally concentric structures (e.g., a generally circular ring). In the illustrated embodiment, the annulus 147 has a width $W_1$ of about 15 microns. In other embodiments, however, the width $W_1$ of the annulus 147 can vary between about 1 micron and about 150 microns. The selected width $W_1$, for example, can be based at least in part on the arrangement or pitch of the terminals 124 and the composition of the dielectric or passivation material that is subsequently disposed onto an opening defined by the annulus 147 (as described in greater detail below with reference to FIG. 2F).

Figure 2E:
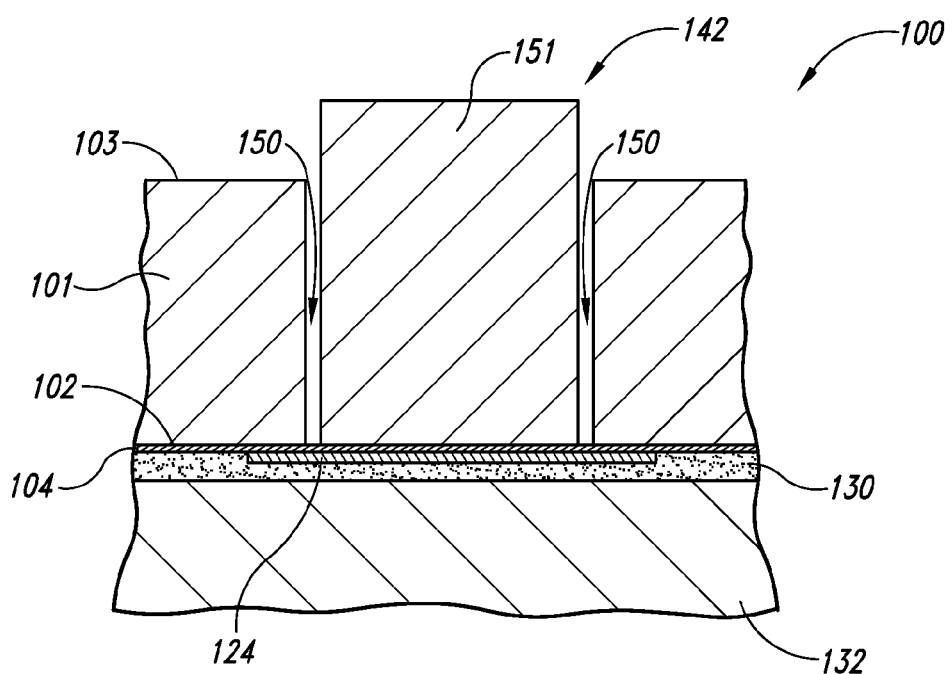

Referring next to FIG. 2E, the exposed portions of the substrate 101 within the annulus 147 (FIGS. 2C and 2D) are etched using a second etching process to form a second opening 150. The second opening 150 is a blind hole or via having a generally annular cross-sectional profile that extends from the back side 103 of the substrate 101 to expose at least a portion of the first dielectric layer 104. For purposes of this disclosure, a "blind hole" or a "blind via" refers to a hole or aperture that extends only partially through the substrate 101 or is otherwise closed at one end. The second opening 150 separates the pillar 142 from the other remaining portions of the substrate 101, thus forming an isolated island, core, or plug 151 of substrate material. The second etching process can include, for example, a deep reactive ion etching process or another suitable etching process that is highly selective to the material of the substrate 101 relative to the material of the first dielectric layer 104. The first dielectric layer 104 can accordingly act as an etch-stop for the second etching process. After forming the second opening 150, the first and second masks 140 and 144 (FIG. 2C) are removed from the workpiece 100. The first and second masks 140 and 144 can be removed, for example, using an oxygen plasma ashing process, a chemical stripper, or another suitable process.

Figure 2F:
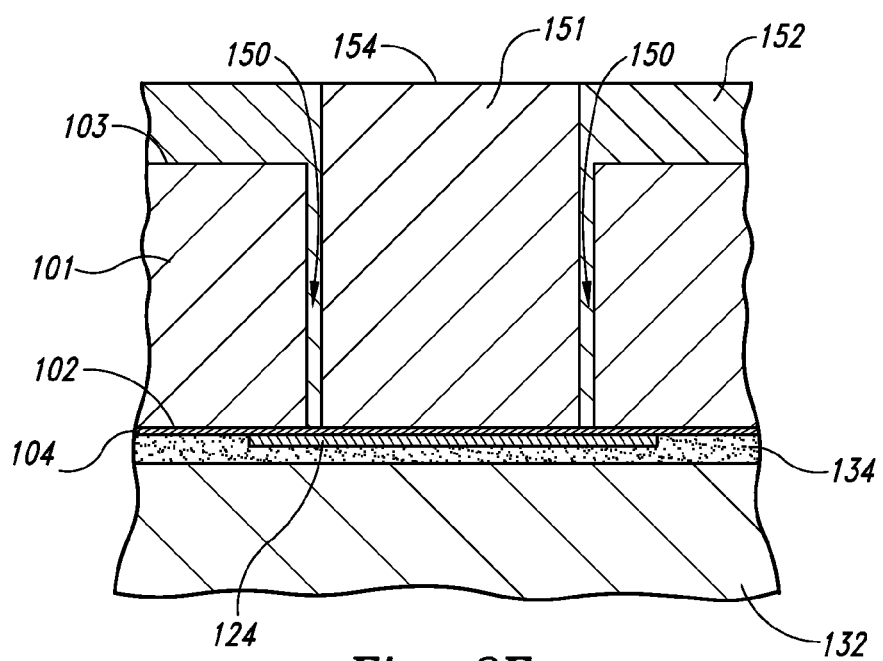

Referring to FIG. 2F, an insulating material 152 is deposited into the second opening 150 and over the entire back side 103 of the substrate 101. The insulating layer 152 electrically insulates components in the substrate 101 from the interconnect that will be subsequently be formed through the substrate 101. In the illustrated embodiment, the insulating material 152 forms a continuous film or layer over the entire back side 103 of the substrate 101 and within the second opening 150, but does not cover or otherwise extend outwardly past an upper surface 154 of the island 151. In other embodiments, however, the insulating material 152 may not extend over the entire back side 103 of the substrate 101. The insulating material 152 can be composed of a polymer material, such as a filled epoxy material. The epoxy material is typically filled with very small beads or particles of materials (e.g., silica, etc.) to produce the desired CTE within the epoxy material that matches or at least approximates the CTE of the surrounding materials. In one embodiment, for example, the insulating material 152 can include Hysol® FP-4511, commercially available from Henkel Loctite Corporation of Industry, California. In other embodiments, however, the insulating material 152 can include other suitable materials.

Figure 2G:
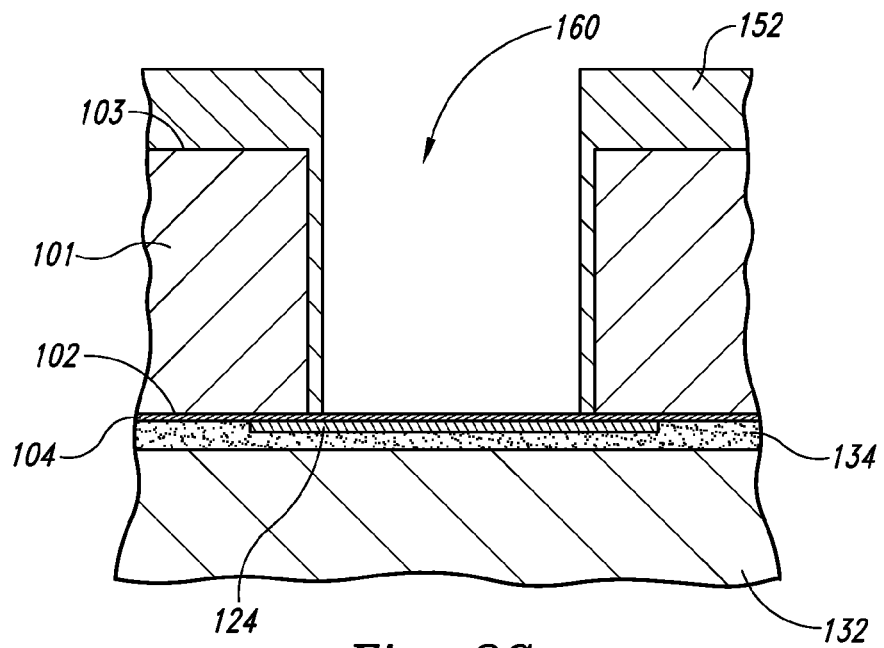
Figure 2H:
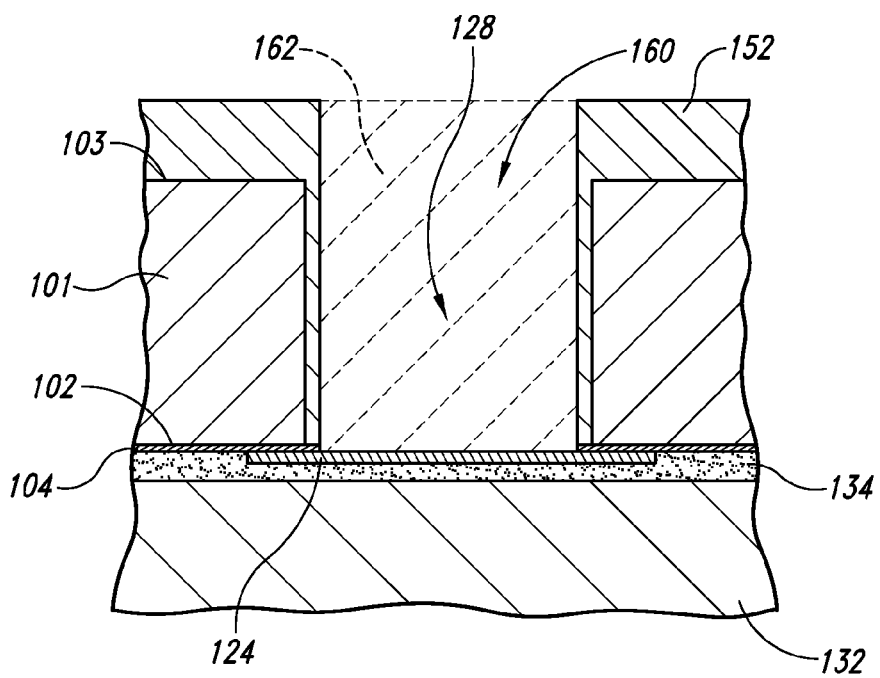

Referring to FIG. 2G, a third etching process (e.g., a wet or dry etch) is used to remove the portions of the substrate that compose the island 151 (FIG. 2F) to define a blind hole or via 160. Referring next to FIG. 2H, a fourth etching process (e.g., a dry etch) is used to remove the exposed portions of the first dielectric layer 104 within the blind hole 160 and expose at least a portion of the terminal 124. The fourth etching process can be highly selective to the material of the first dielectric layer 104 relative to the material of the terminal 124. The fourth etching process accordingly does not damage or significantly alter the general structure of the terminal 124.

After exposing at least a portion of the terminal 124, the workpiece 100 can undergo further processing prior to singulating the individual imaging dies 110 (FIG. 1). For example, a seed layer (not shown) can be deposited into the blind hole 160 and over at least a portion of the insulating material 152 using a suitable vapor deposition technique, such as physical vapor deposition (PVD), chemical vapor deposition (CVD), atomic layer deposition (ALD), and/or plating. The seed layer can be composed of copper or other suitable materials. A conductive fill material 162 (shown in broken lines) can then be deposited into the blind hole 160 to form the interconnect 128. The fill material 162 can include Cu, Ni, Co, Ag, Au, solder, or other suitable materials or alloys of materials having the desired conductivity. The fill material 162 can be deposited into the blind hole 160 using plating processes (e.g., electroless or electroplating processes), solder wave processes, screen printing techniques, vapor deposition processes, or other suitable techniques. In some embodiments, the fill material 162 does not completely fill the blind hole 160. For example, in one embodiment the fill material 162 may only line the sidewalls of the blind hole 160, thus leaving a portion of the blind hole hollow. After forming the interconnect 128, a redistribution layer (not shown) may be formed at the back side 103 of the substrate 101, and the support member 132 and adhesive material 134 can be removed from the front side 102 of the substrate 101.

Several embodiments of the methods described above for forming the interconnects 128 (FIG. 1) may provide improved package reliability and robustness as compared with conventional packaged microelectronic devices. For example, one significant problem with many conventional microelectronic devices is that thermal cycling induces stresses that can cause components to delaminate. The stresses are induced because many of the materials in a microelectronic package have different CTEs so that they do not expand and contract the same amount during thermal cycling. As such, delamination often occurs at the interfaces between various components and/or materials in the device. This in turn often leads to failure or malfunction of such devices. As discussed above, however, the insulating material 152 deposited into the second opening 150 and over the back side 103 of the substrate 101 is composed of a polymer material (e.g., a filled epoxy material) that has a CTE approximately the same as the adjacent material. In one particular embodiment, for example, the insulating material 152 can have a CTE of between about 22 and about 30 ppm/° C., and the substrate 101 (e.g., a silicon material) can have a CTE of between about 15 and about 25 ppm/° C. Accordingly, the insulating material 152 is expected to help prevent excessive warping and/or undesirable relative movement between the various components during thermal processing.

As mentioned previously, in many conventional processes for constructing interconnects, the sidewalls of the openings or through-holes formed in the substrate are lined with one or more dielectric layers before depositing a conductive fill material into the corresponding opening. The dielectric layer(s) electrically insulate components in the substrate from the interconnect that is subsequently formed in the opening. Conventional dielectric layer(s) are typically composed of a low temperature CVD material (e.g., a low temperature CVD oxide applied using a pulsed layer deposition process, tetraethylorthosilicate, $Si_3N_4$, $SiO_2$, parylene) and/or other suitable dielectric materials that can be deposited onto the walls within the opening. One significant drawback with such processes, however, is that only dielectric materials that can conformally coat the sidewalls of the opening can be used. Many of these materials, however, are extremely expensive, difficult to apply, and/or have CTEs that are significantly different than the other components of the assembly.

In contrast with conventional processes, embodiments of the methods described herein allow a wide variety of different dielectric or insulating materials to be used to electrically insulate the components in the substrate 101 from the interconnect 128. For example, any type of insulating material 152 that can flow into the annular-shaped second opening 150 can be used. The material selection is not limited to only materials that can conformally coat the sidewalls of the via 160. Accordingly, insulating materials having any of a variety of desired properties may be used when forming the interconnects 128, thereby resulting in improved processes and microelectronic packages.

Figure 3A:
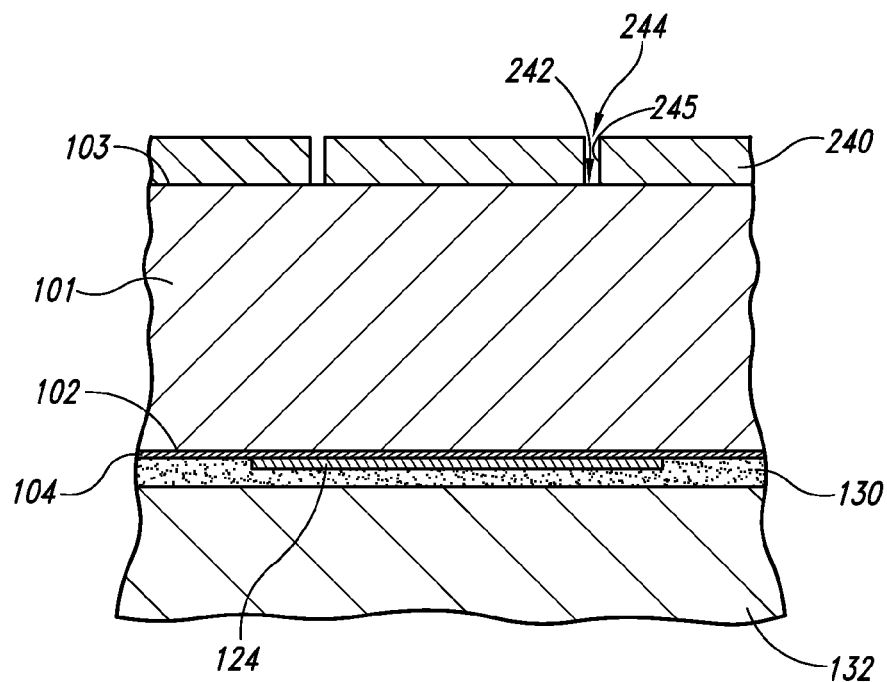
FIGS. 3A-3G are schematic, side cross-sectional views illustrating various stages in a method for forming an electrically conductive interconnect structure for providing a back side array of contact pads in accordance with another embodiment of the disclosure.
Figure 3B:
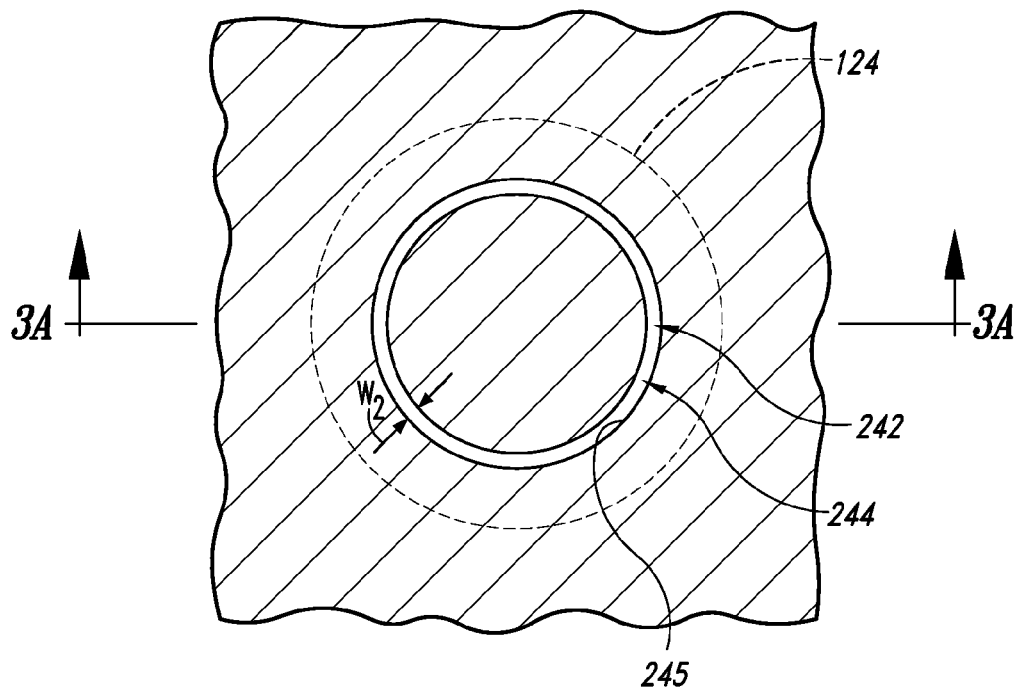

FIGS. 3A-3G illustrate various stages of another embodiment of a method for forming the interconnects 128 of FIG. 1. FIG. 3A, for example, is a schematic side cross-sectional view of a portion of a workpiece 200 at an initial stage of this process, and FIG. 3B is a top view of the portion of the back side 103 of the substrate 101 shown in FIG. 3A. Referring to FIGS. 3A and 3B together, the first part of this method is generally similar to the steps described above with reference to FIG. 2A. In previous processing steps, for example, the support member 132 has been attached to the front side 102 of the substrate 101 with the adhesive material 134, and the substrate 101 has been thinned to a desired thickness. The stage of the method shown in FIGS. 3A and 3B, however, differs from that described above in FIG. 2A in that a first mask 240 is deposited onto the back side 103 and patterned differently than the first mask 140 described above with reference to FIG. 2A. For example, the first mask 240 can be a layer of resist that is patterned and etched to form a first opening 242 aligned with each terminal 124. The first opening 242 defines an annulus 244 having an outer periphery 245 inboard of a periphery portion of the terminal 124. The annulus 244, for example, is superimposed relative to the terminal 124 and has a first diameter or cross-sectional dimension less than a second diameter or cross-sectional dimension of the terminal 124. In the illustrated embodiment, the annulus 244 has a width $W_2$ generally similar to the width $W_1$ of the annulus 147 described above with reference to FIGS. 2C and 2D. In other embodiments, however, the annulus 244 can have a different width $W_2$. Moreover, in this embodiment the portions of the first mask 240 at the back side 103 of the substrate 101 are typically not overbaked because they do not need to remain on the substrate 101 during a number of subsequent processing steps.

Figure 3C:
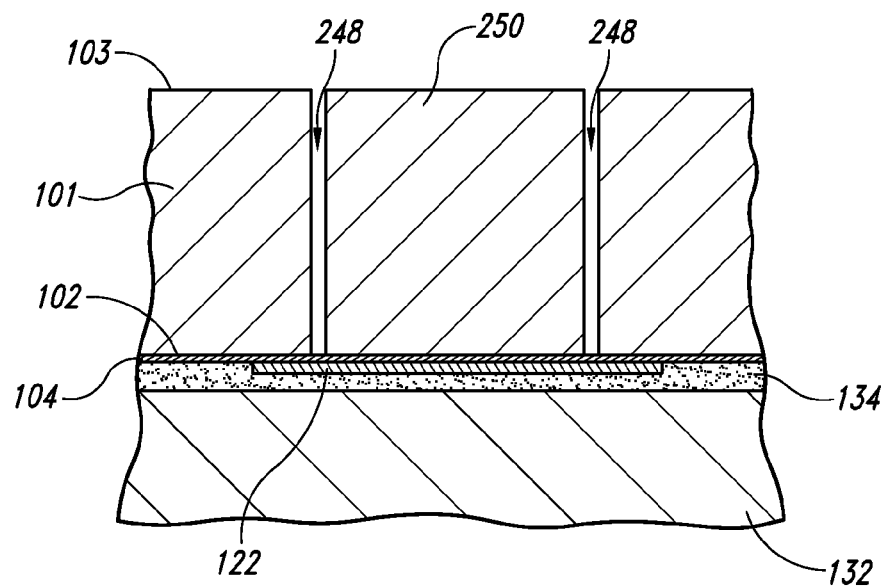

Referring next to FIG. 3C, the exposed portions of the substrate 101 within the annulus 244 (FIGS. 3A and 3B) are etched using a first etching process to form a second opening 248. The second opening 248 is generally similar to the second opening 150 described above with reference to FIG. 2E. For example, the second opening 248 is a blind hole or via having a generally annular cross-sectional profile that extends from the back side 103 of the substrate 101 to the first dielectric layer 104. The first etching process (e.g., a reactive ion etching process) selectively removes material from the substrate 101 and generally does not remove material from the first dielectric layer 104. The remaining portion of the substrate 101 within the second opening 248 defines an island 250 that is isolated from the rest of the substrate 101 by the second opening 248. After forming the second opening 248, the first mask 240 (FIG. 3A) is removed from workpiece 200.

Figure 3D:
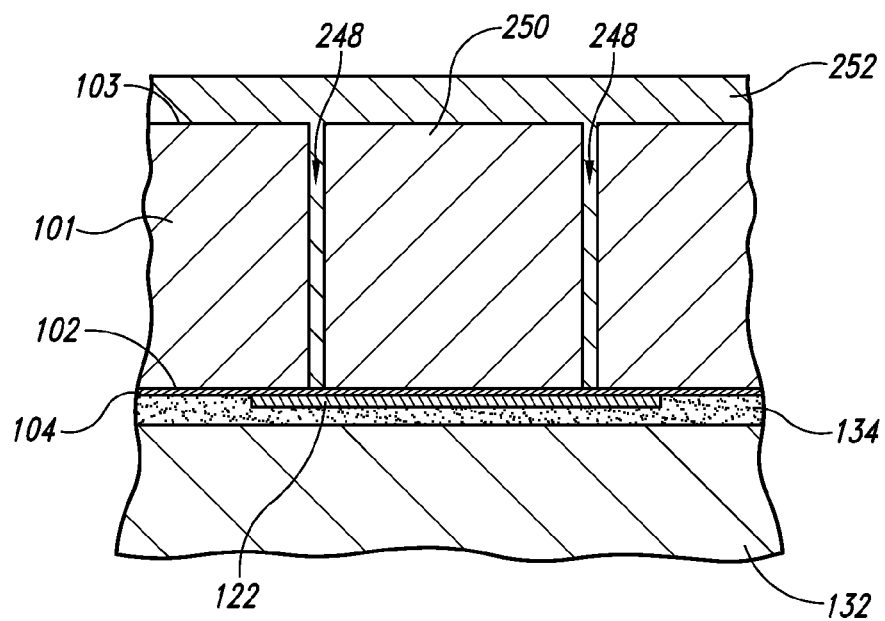

Referring to FIG. 3D, an insulating material 252 is deposited into the second opening 248 and over the entire back side 103 of the substrate 101. The insulating material 252 can be composed of a polymer material (e.g., a filled epoxy material) generally similar to the insulating material 152 described above with reference to FIG. 2F. In other embodiments, however, the insulating material 252 can include other suitable materials.

Figure 3E:
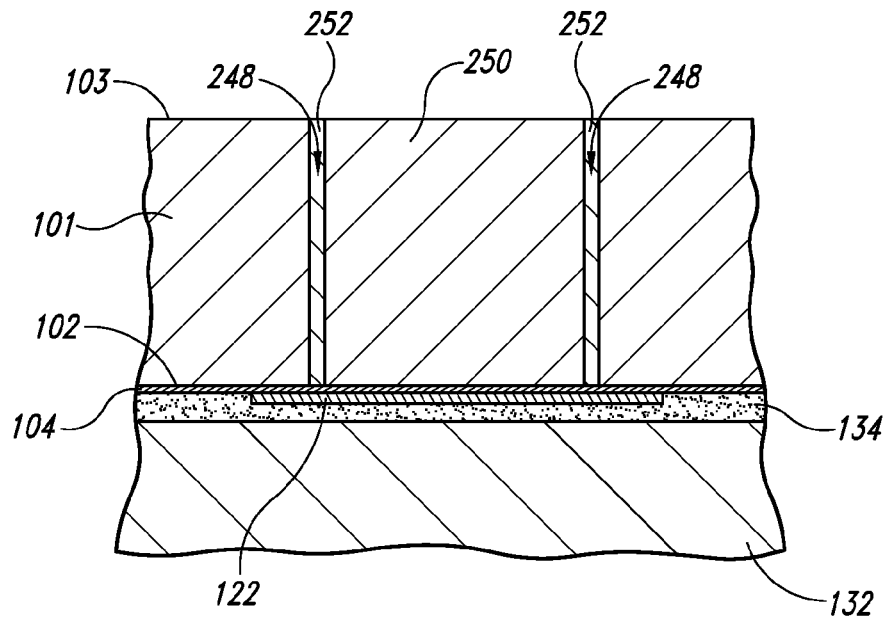

Referring next to FIG. 3E, the overburden portion of the insulating material 252 on the back side 103 of the substrate 101 is removed to leave insulating material 252 only in the second opening 248. The overburden portion of the insulating material 252 can be removed using a chemical-mechanical planarization (CMP) process, an etching process, and/or other suitable processes. In the illustrated embodiment, the back side 103 of the substrate 101 was not previously polished and, accordingly, the back side 103 can be polished during and/or after removing the overburden portion of the insulating material 252. In other embodiments, however, the back side 103 may be polished before the processing steps described above with reference to FIG. 3A. In such cases, the overburden portion of insulating material 252 may be removed from the back side 103 using an "ashing" process at least generally similar to the process described above with reference to FIG. 2D rather than a CMP or etching process.

Figure 3F:
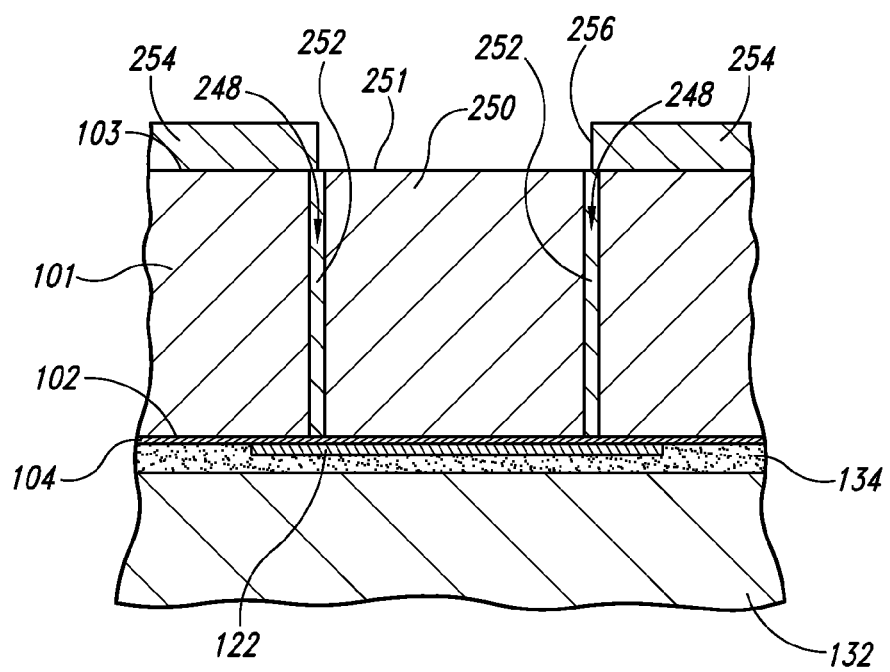

Referring to FIG. 3F, a second dielectric layer 254 (e.g., an RDL insulating layer) is deposited over the back side 103 and patterned to form a third opening 256. The third opening 256 is sized such that a periphery portion of the second opening 256 is at least partially aligned with the insulating material 252 within the second opening 248 and an exterior surface 251 of the island 250 is completely exposed. The second dielectric layer 254 can include a photosensitive polymer material (e.g., a resist material) or another suitable material.

Figure 3G:
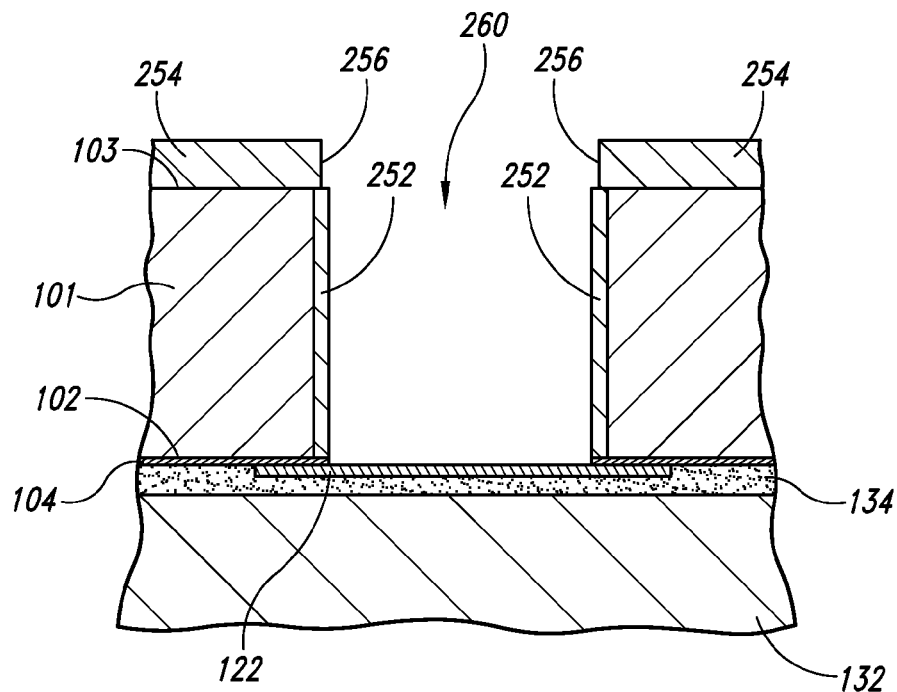

Referring next to FIG. 3G, a second etching process (e.g., a wet etch) is used to remove the exposed island 250 (FIG. 3F) to define a blind hole or via 260. After removing the island, a third etching process (e.g., a dry etch) is used to remove the exposed portions of the first dielectric layer 104 within the blind hole 260 and expose at least a portion of the terminal 124. After the third etching process, the workpiece 200 can undergo additional steps that are at least generally similar to those described above with reference to FIG. 2F to construct an interconnect 128 (FIG. 1).

Figure 4:
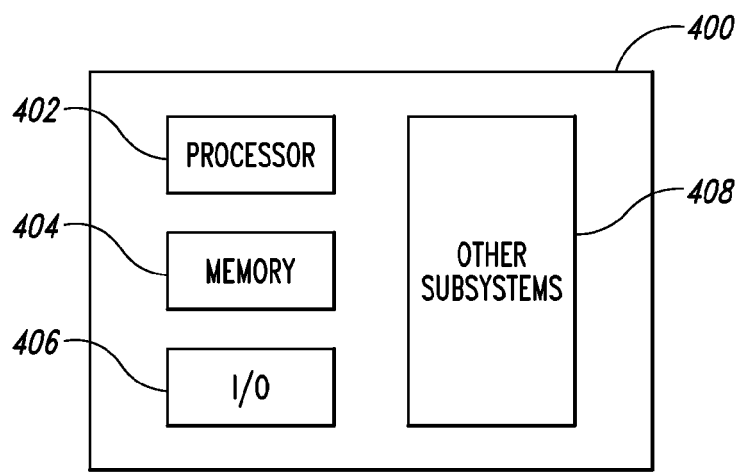
FIG. 4 is a schematic view of a system incorporating one or more microelectronic imagers.

Any one of the imaging dies formed using the methods described above with reference to FIGS. 1-3G can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory device), input/output devices 406, and/or other subsystems or components 408. The foregoing imager devices described above with reference to FIGS. 1-3G may be included in any of the components shown in FIG. 4. The resulting system 400 can perform any of a wide variety of computing, processing, storage, sensing, imaging, and/or other functions. Accordingly, representative systems 400 include, without limitation, cameras, computers and/or other data processors, for example, desktop computers, laptop computers, Internet appliances, hand-held devices (e.g., palm-top computers, wearable computers, cellular or mobile phones, personal digital assistants, etc.), light or other radiation sensors, multiprocessor systems, processor-based or programmable consumer electronics, network computers, and minicomputers. Other representative systems 400 include servers and associated server subsystems, display devices, and/or memory devices. Components of the system 400 may be housed in a single unit or distributed over multiple, interconnected units (e.g., through a communications network). The components of the system 400 can accordingly include local and/or remote memory storage devices, and any of a wide variety of computer readable media.

From the foregoing, it will be appreciated that specific embodiments have been described herein for purposes of illustration, but well-known structures and functions have not been shown or described in detail to avoid unnecessarily obscuring the description of the embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded.

It will further be appreciated that specific embodiments have been described herein for purposes of illustration, but that the foregoing methods and systems may have other embodiments as well. For example, a variety of materials in addition to those described above can be used to form the insulating layers that electrically insulate components in the workpiece from the interconnects that extend through at least a portion of the workpiece. Moreover, one or more of the openings or holes described above can alternatively be formed using a laser in addition to, or in lieu of, an etching process. Accordingly, embodiments of the disclosure are not limited except as by the appended claims.

I claim:

1. A microelectronic workpiece, comprising:
a semiconductor substrate having a front side, a back side, and a plurality of microelectronic dies on and/or in the substrate, the individual dies including integrated circuitry and a terminal electrically coupled to the integrated circuitry;
an island of substrate material at least partially aligned with the terminal and separated from the substrate, wherein the island and the substrate define an opening having a generally annular cross-sectional profile extending from the back side toward the front side and at least partially aligned with the terminal, and wherein the island of substrate material has an upper surface that extends outwardly past the back side of the substrate; and
an insulating material disposed in the opening and in contact with the substrate.

2. The microelectronic workpiece of claim 1 wherein the opening comprises a blind hole having a generally annular cross-sectional profile extending through the substrate in alignment with the terminal, and wherein the blind hole does not extend completely through the terminal.

3. The microelectronic workpiece of claim 1, further comprising a volume of insulating material disposed on the back side of the substrate, and wherein the insulating material in the opening and the insulating material on the back side of the substrate form a single, generally continuous layer.

4. The microelectronic workpiece of claim 1 wherein the insulating material does not cover or otherwise extend outwardly past the upper surface of the island of substrate material.

5. The microelectronic workpiece of claim 1 wherein the insulating material comprises a polymer material having a CTE at least generally similar to the CTE of the substrate.

6. The microelectronic workpiece of claim 1 wherein the insulating material comprises a filled epoxy material.

7. The microelectronic workpiece of claim 1 wherein the opening has a width of from about 1 micron to about 150 microns.

8. The microelectronic workpiece of claim 1, further comprising a support member releasably attached to the front side of the substrate.

9. A microelectronic workpiece including a semiconductor substrate having a front side and a back side, the workpiece comprising:
a plurality of microelectronic imaging dies on and/or in the semiconductor substrate, the individual imaging dies including—
integrated circuitry;
an image sensor electrically coupled to the integrated circuitry;
an array of bond-pads electrically coupled to the integrated circuitry;
a plurality of islands of substrate material at least partially aligned with the bond-pads and separated from the substrate, wherein the islands and the substrate define a plurality of generally circular bands extending from the back side toward the front side, wherein the generally circular bands are aligned with at least a portion of the corresponding bond-pads and do not extend through the bond-pads, and wherein the islands of substrate material include upper surfaces extending outwardly beyond the back side of the substrate; and
a dielectric material disposed within at least a portion of each generally circular band, wherein the dielectric material has a CTE at least approximately the same as a CTE of the substrate material.

10. The microelectronic workpiece of claim 9 wherein the dielectric material has a CTE of from about 22 to 330 ppm/° C.

11. The microelectronic workpiece of claim 9 wherein the semiconductor substrate has a thickness of about 100 to 150 microns.

12. A system, comprising:
at least one of a processor and a memory device, wherein at least one of the processor and the memory device includes a semiconductor component comprising—
a substrate having a front side, a back side, and a microelectronic die on and/or in the substrate, wherein the microelectronic die includes integrated circuitry and a terminal electrically coupled to the integrated circuitry;
a plug of substrate material at least partially aligned with the terminal and separated from the substrate, wherein the plug and the substrate define an opening having a generally annular cross-sectional profile extending from the back side toward the front side and at least partially aligned with the terminal, and wherein the plug of substrate material has an upper surface that extends outwardly past the back side of the substrate; and
an dielectric material disposed in the opening and in contact with the substrate, wherein the dielectric material has a CTE at least approximately the same as a CTE of the substrate.

13. The system of claim 12 wherein the opening is superimposed relative to the terminal and has a first cross-sectional dimension less than a second cross-sectional dimension of the terminal.

14. The system of claim 12, further comprising a volume of dielectric material on the back side of the substrate, and wherein the dielectric material on the back side of the substrate and in the opening form a single, generally continuous film.

* * * * *